(12) United States Patent
Barkarö et al.

(10) Patent No.: US 7,839,993 B2
(45) Date of Patent: Nov. 23, 2010

(54) ECHO CANCELING ARRANGEMENT

(75) Inventors: Stefan Barkarö, Åkersberga (SE);
Torbjörn Randahl, Nacka (SE)

(73) Assignee: Lantiq Deutschland GmbH, Neubiberg (DE)

( * ) Notice: Subject to any disclaimer, the term of this patent is extended or adjusted under 35 U.S.C. 154(b) by 1526 days.

(21) Appl. No.: 10/821,781

(22) Filed: Apr. 9, 2004

(65) Prior Publication Data

US 2004/0218754 A1 Nov. 4, 2004

Related U.S. Application Data

(63) Continuation of application No. PCT/SE02/01688, filed on Sep. 18, 2002.

(30) Foreign Application Priority Data

Oct. 11, 2001 (SE) .................................. 0103414

(51) Int. Cl.
*H04M 1/00* (2006.01)
*H04M 9/00* (2006.01)
(52) U.S. Cl. .................. 379/390.04; 379/394
(58) Field of Classification Search ................. 379/394, 379/390.04
See application file for complete search history.

(56) References Cited

U.S. PATENT DOCUMENTS

| | | | | |
|---|---|---|---|---|
| 3,904,838 A | * | 9/1975 | Stewart | 379/344 |
| 5,448,182 A | | 9/1995 | Countryman et al. | 326/30 |
| 6,295,343 B1 | * | 9/2001 | Hjartarson et al. | 379/93.05 |
| 2003/0031139 A1 | * | 2/2003 | Thilenius | 370/286 |
| 2005/0286710 A1 | * | 12/2005 | Barkaro et al. | 379/398 |

FOREIGN PATENT DOCUMENTS

| | | |
|---|---|---|
| EP | 0 323 586 A2 | 12/1988 |
| EP | 1 187 411 A2 | 3/2002 |
| EP | 1 195 913 A1 | 4/2002 |
| WO | WO 99/50970 | 10/1999 |

* cited by examiner

*Primary Examiner*—Alexander Jamal
(74) *Attorney, Agent, or Firm*—SpryIP, LLC

(57) ABSTRACT

In a line driver/receiver circuit where the line driver is connected with its output terminals to a load for supplying a transmit signal thereto and where the receiver is connected with its input terminals to the load for simultaneously receiving a receive signal therefrom, the transmit signal on the input terminals of the receiver is canceled by connecting the output terminals of the line driver to the load via equal complex sense impedances of an impedance value that is much smaller than the impedance value of the load impedance to match the load impedance, connecting the input terminals of the receiver to the load via equal first resistors and to respective output terminal of the line driver via equal second resistors, and providing transconductance amplifiers to sense the voltage across the sense impedances and supply corresponding currents to respective input terminal of the line driver.

10 Claims, 1 Drawing Sheet

US 7,839,993 B2

ECHO CANCELING ARRANGEMENT

CROSS REFERENCE TO RELATED APPLICATION

This application is a continuation of copending International Application No. PCT/SE02/0168 filed Sep. 18, 2002 which designates the United States, and claims priority to Swedish application no. 0103414-9 filed Oct. 11, 2001.

TECHNICAL FIELD OF THE INVENTION

The invention relates generally to line driver/receiver circuits and more specifically to an echo canceling arrangement in such circuits.

BACKGROUND OF THE INVENTION

In many broadband applications such as Asymmetric Digital Subscriber Line (ADSL), a receive signal is received in a line driver/receiver circuit at the same time as a transmit signal is sent over one and the same transmission line.

The transmit signal that is much stronger than the receive signal that is damped by the transmission line, will be coupled with its distortion into the receiver and degrade the signal-to-noise ratio (SNR) of the receive signal.

Since the bitrate of the receive communication is decided in advance during a so-called training sequence by the detected SNR for the receive signal, also the bitrate of the receive signal will degrade.

To solve this problem, it is known to use echo cancellers.

FIG. 1 on the appended drawing is a schematic illustration of an embodiment of a known line driver/receiver circuit with an echo cancellation bridge.

The line driver 1 is connected with its output terminals via equal drive impedances ZT to a load impedance ZL that comprises a transformer connected to a transmission line that is connected to a subscriber station with a line driver/receiver circuit for transmitting and receiving signals to and from the transmission line.

The receiver 2 is connected with its input terminals to the load ZL for simultaneously receiving a receive signal from the transmission line.

To cancel the transmit signal and distortion on the input terminals of the receiver 2, the input terminals of the receiver 2 are connected to the load via equal resistors R1 and to respective output terminal of the line driver 1 via equal resistors R2.

In the embodiment in FIG. 1, the sum of the drive impedances 2ZT shall have the same impedance value as the load impedance ZL.

Since the output impedance of the line driver 1 is very low compared to the drive impedances ZT, no receive signal at all will be present at the interface between the line driver 1 and the resistor bridge R1, R2. However, at the interface between the resistor bridge R1, R2 and the load ZL both transmit and receive signals will be present.

It can be shown that by applying the resistor bridge RI, R2, the transmit signal can be totally canceled at the input terminals of the receiver 2 while the receive signal is still present.

In line drivers with active termination impedance, the drive impedance ZT in FIG. 1 would be set by a feedback loop inside the line driver 1. The advantage of such line drivers is that the output signal levels can be lowered for a given transmit power over the load ZL. Hereby, it will be possible to reduce the supply voltage and, consequently, the power consumption.

However, also in such line drivers, there is a need of good echo cancellation of transmit signals at the receiver input.

SUMMARY OF THE INVENTION

The object of the invention is to bring about good echo cancellation in line drivers/receiver circuits with active termination impedance.

This is attained by providing complex sense impedances to match the load impedance. The sense impedance value should be much smaller than the impedance value of the load impedance seen between the outputs of the line driver. Transconductance amplifiers are used for sensing the voltage across the sense impedances and supplying corresponding currents to respective input terminal of the line driver. To achieve echo cancellation a pure resistive bridge is applied across the sense impedances. The output of the bridge is connected to the receiver.

For example, in a line driver/receiver circuit where the line driver is connected with its output terminals to a load for supplying a transmit signal thereto and where the receiver is connected with its input terminals to the load for simultaneously receiving a receive signal therefrom, an arrangement is provided for canceling the transmit signal on the input terminals of the receiver, the output terminals of the line driver being connected to the load via equal first impedances, the input terminals of the receiver being connected to the load via equal first resistors and to respective output terminal of the line driver via equal second resistors, wherein the first impedances are complex impedances to match the load impedance and are of an impedance value that is much smaller than the impedance value of the load impedance, and transconductance amplifiers are provided to sense the voltage across the first impedances and supply corresponding currents to respective input terminal of the line driver.

A drive/termination impedance of the line driver may equal the impedance value of one of the impedances multiplied by k, wherein k is a function of the line driver gain and the transconductance amplifier gains.

Also, an echo canceling arrangement comprises a line driver having two inputs and two outputs, a load coupled with the outputs of the line driver via first and second impedances, a line receiver having two inputs, wherein the inputs are coupled through a network with the load and the outputs of said line driver, first and second transconductance amplifiers having two inputs and an output, wherein the inputs of the first transductance amplifier are coupled with the first impedance and its output with the one input of the line driver and the inputs of the second transductance amplifier are coupled with the second impedance and its output with the other input of the line driver, wherein the first impedances are complex impedances to match the load impedance and are of an impedance value that is much smaller than the impedance value of the load impedance.

The network may comprise a first resistor coupled between one input of the line receiver and the load, a second resistor coupled between the one input and one output of the line driver, a third resistor coupled between the other input of the line receiver and the load, and a fourth resistor coupled between the other input and the other output of the line driver. The first and third resistor may be equal and the second and fourth resistor may be equal. A drive/termination impedance of the line driver may equal the impedance value of one of the impedances multiplied by k, wherein k is a function of the line driver gain and the transconductance amplifier gains.

BRIEF DESCRIPTION OF THE DRAWING

The invention will be described more in detail below with reference to the appended drawing on which FIG. 1, described above, illustrates a known line driver/receiver circuit with an echo cancellation bridge.

DESCRIPTION OF THE INVENTION

Figure 2:
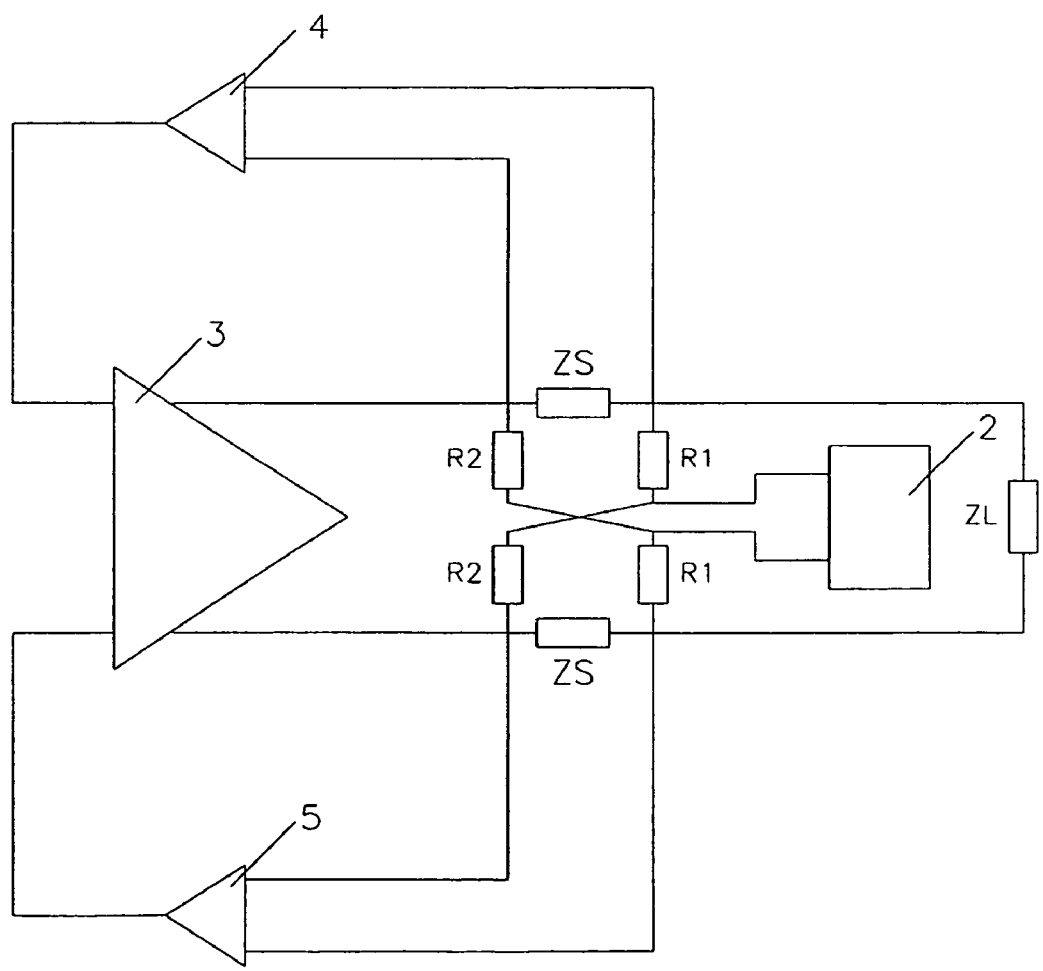
FIG. 2 illustrates a line driver/receiver circuit with active termination impedance with an echo cancellation arrangement according to the invention.

FIG. 2 illustrates a line driver/receiver circuit with active termination impedance with an echo cancellation arrangement according to the invention.

Figure 1:
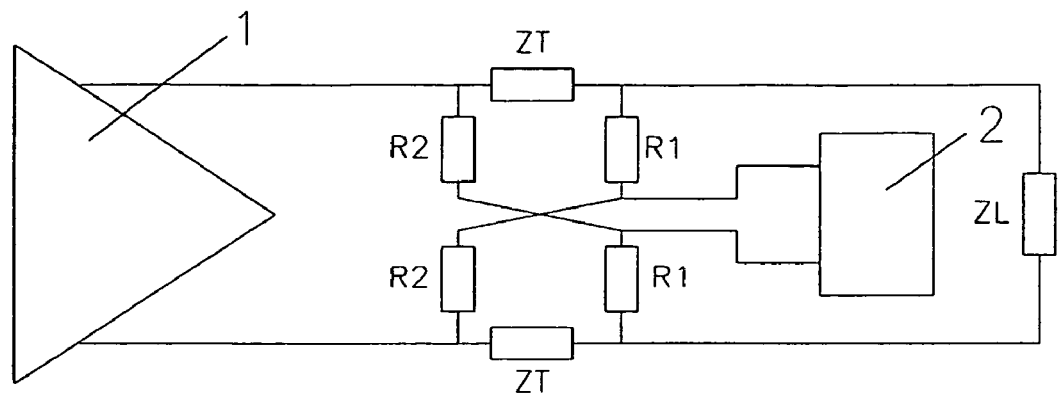

Components in FIG. 2 that are identical to components in FIG. 1 are provided with identical reference characters.

In accordance with the invention, a line driver 3 is connected with its output terminals via equal so-called sense impedances ZS to a load ZL that, in the same manner as in FIG. 1, comprises a transformer connected to a transmission line that is connected to a subscriber station with a line driver/receiver circuit for transmitting and receiving signals to and from the transmission line.

A receiver 2 is connected with its input terminals to the load ZL for simultaneously receiving a receive signal from the transmission line.

As in FIG. 1, the input terminals of the receiver 2 are connected to the load ZL via equal resistors R1 and to respective output terminal of the line driver 1 via equal resistors R2.

In accordance with the invention, the sense impedances ZS are complex impedances to match the load impedance ZL, and are of an impedance value that is much smaller than the impedance value of the load impedance ZL.

In accordance with the invention, the voltage across the respective sense impedance ZS is sensed by means of transconductance amplifiers 4, 5 that are connected with their input terminals across the respective sense impedance ZS, and with their output terminal to respective input terminal of the line driver 3.

The transconductance amplifiers 4, 5 generate output currents corresponding to the sensed voltage. These output currents are supplied to the respective input terminal of the line driver 3.

The drive/termination impedance of the line driver equals k×ZS, where k is a function of the gains of the line driver 3 and the transconductance amplifiers 4, 5. The drive/termination impedance is correctly matched to the load when k×ZS=ZL. Any combination of k and ZS that fulfills this equation can be chosen.

We claim:

1. A circuit comprising a line driver having output terminals connected to a load for supplying a transmit signal to the load and a line receiver having input terminals connected to the load for simultaneously receiving a receive signal from the load, an arrangement for canceling the transmit signal on the input terminals of the line receiver, the output terminals of the line driver being connected to the load via equal first impedances, the input terminals of the line receiver being connected to the load via equal first resistors and to respective ones of the line driver output terminals via equal second resistors, wherein the first impedances are complex impedances of an impedance value that is much smaller than an impedance value of the load so that a drive/termination impedance of the line driver matches the load impedance, and transconductance amplifiers are provided to sense the voltage across the first impedances and supply corresponding currents to respective ones of the line driver input terminals.

2. The circuit according to claim 1, wherein the drive/termination impedance of the line driver equals the impedance value of one of the first impedances multiplied by k, wherein k is a function of the line driver gain and the transconductance amplifier gains.

3. An echo canceling arrangement comprising:
a line driver having two inputs and two outputs,
a load coupled with the outputs of the line driver via first and second impedances,
a line receiver having two inputs, wherein the inputs are coupled through a network with the load and the outputs of said line driver,
first and second transconductance amplifiers having two inputs and an output, wherein the inputs of the first transconductance amplifier are coupled with the first impedance and its output with the one input of the line driver and the inputs of the second transconductance amplifier are coupled with the second impedance and its output with the other input of the line driver,
wherein the first and second impedances are complex impedances of an impedance value that is much smaller than an impedance value of the load so that a drive/termination impedance of the line driver matches the load impedance.

4. The echo canceling arrangement according to claim 3, wherein the network comprises:
a first resistor coupled between one input of the line receiver and the load,
a second resistor coupled between the one input and one output of the line driver,
a third resistor coupled between the other input of the line receiver and the load, and
a fourth resistor coupled between the other input and the other output of the line driver.

5. The echo canceling arrangement according to claim 3, wherein the first and third resistors are equal and the second and fourth resistors are equal.

6. The echo canceling arrangement according to claim 3, wherein the drive/termination impedance of the line driver equals the impedance value of one of the first or second impedances multiplied by k, wherein k is a function of the line driver gain and the transconductance amplifier gains.

7. An asymmetric digital subscriber line (ADSL) driver receiver circuit comprising:
an ADSL driver having two inputs and two outputs,
a load coupled with the outputs of the driver via first and second impedances,
an ADSL receiver having two inputs, wherein the inputs are coupled through a network with the load and the outputs of said driver,
first and second transconductance amplifiers having two inputs and an output, wherein the inputs of the first transconductance amplifier are coupled with the first impedance and its output with the one input of the driver and the inputs of the second transconductance amplifier are coupled with the second impedance and its output with the other input of the driver,
wherein the first and second impedances are complex impedances of an impedance value that is much smaller than an impedance value of the load so that a drive/termination impedance of the line driver matches the load impedance.

8. The circuit according to claim 7, wherein the network comprises:
   a first resistor coupled between one input of the receiver and the load,
   a second resistor coupled between the one input and one output of the driver,
   a third resistor coupled between the other input of the receiver and the load, and
   a fourth resistor coupled between the other input and the other output of the driver.

9. The circuit according to claim 7, wherein the first and third resistors are equal and the second and fourth resistors are equal.

10. The circuit according to claim 7, wherein the drive/termination impedance of the driver equals the impedance value of one of the first or second impedances multiplied by k, wherein k is a function of the driver gain and the transconductance amplifier gains.

* * * * *